(12) United States Patent
Burroughes

(10) Patent No.: US 6,828,724 B2
(45) Date of Patent: Dec. 7, 2004

(54) LIGHT-EMITTING DEVICES

(75) Inventor: Jeremy Henley Burroughes, Cambridge (GB)

(73) Assignee: Cambridge Display Technology Limited, Cambridgeshire (GB)

(*) Notice: Subject to any disclaimer, the term of this patent is extended or adjusted under 35 U.S.C. 154(b) by 78 days.

(21) Appl. No.: 10/276,164

(22) PCT Filed: May 8, 2001

(86) PCT No.: PCT/GB01/01990

§ 371 (c)(1), (2), (4) Date: Nov. 11, 2002

(87) PCT Pub. No.: WO01/88990

PCT Pub. Date: Nov. 22, 2001

(65) Prior Publication Data

US 2003/0076454 A1 Apr. 24, 2003

(51) Int. Cl.[7] .................................................. H01J 1/62
(52) U.S. Cl. ..................... 313/503; 313/504; 313/505
(58) Field of Search ..................... 313/503–507; 353/20, 30, 38, 122; 349/61, 70; 359/40, 49–50, 478, 619–626

(56) References Cited

U.S. PATENT DOCUMENTS

| | | | |
|---|---|---|---|
| 4,559,116 A | * 12/1985 | Ellis et al. | 205/655 |
| 4,780,643 A | * 10/1988 | Ellis et al. | 313/503 |
| 4,874,986 A | * 10/1989 | Menn et al. | 313/505 |
| 4,929,061 A | 5/1990 | Tominaga et al. | |
| 5,550,656 A | 8/1996 | Sprague et al. | |
| 6,221,194 B1 | * 4/2001 | Watanabe et al. | 156/272.2 |

FOREIGN PATENT DOCUMENTS

| | | |
|---|---|---|
| EP | 0984314 | 3/2000 |
| EP | 1024399 | 8/2000 |
| GB | 2268304 | 1/1994 |
| JP | 10-039791 | 2/1998 |
| JP | 11-162233 | 6/1999 |

OTHER PUBLICATIONS

International Search Report—PCT/GB/01990; ISA/EPO; Aug. 14, 2001.
United Kingdom Search Report—GB 0011749.9; Oct. 19, 2000.

* cited by examiner

Primary Examiner—Mohammad Sikder
(74) Attorney, Agent, or Firm—Harness Dickey & Pierce, P.L.C.

(57) ABSTRACT

A light-emitting device comprising a first electroluminescent element for emitting light of a first color when energized and a second electroluminescent element for emitting light of a second color when energized, characterized in that dimensions of the first and second elements and any spacing therebetween are selected to create an overall impression of a single light source when simultaneously energized and viewed as intended.

8 Claims, 4 Drawing Sheets

KEY:—
⊘ – RED EMITTER
⊗ – BLUE EMITTER
○ – GREEN EMITTER

LIGHT-EMITTING DEVICES

DESCRIPTION

The present invention relates to a light-emitting device, particularly but not exclusively, an electro luminescent device for use as a backlight to an LCD display, and displays incorporating such devices. The electroluminescence for the electroluminescent device may be suitably provided by means of an organic light-emissive material (see for example International Publication WO90/13148).

By way of background, FIG. 1 shows the typical cross-sectional structure of an organic light-emissive device. The device is fabricated on a substrate (1) coated with a transparent first electrode (2) such as indium-tin-oxide. The coated substrate is overcoated with at least one layer of a thin film of an electroluminescent organic material (3) and a final layer forming a second electrode (4) which is typically of metal. By using a transparent substrate (e.g. of glass or plastics material), light generated in the film (3) is able to leave the device by passing through the first electrode (2).

The performance of electroluminescent devices has advanced rapidly over the past few years. Due to their high efficiencies, the devices show potential for a wide range of display applications, from simple backlights to graphic displays, such as television screens, computer monitors and palm-top devices which may consist of several million pixels. In particular, organic light-emissive material may be used in the fabrication of backlights for transmissive or transflective liquid crystal displays. In a liquid crystal display there is typically a planar liquid crystal cell which has active regions where the optical properties of the liquid crystal material can be altered by the application of an electric field to vary the transmission of light through the active regions. In a transmissive liquid crystal display there is a light source behind the liquid crystal cell; and light from the source shines to an observer through those regions permitted to transmit light. In a transflective liquid display, the light source is supplemented by a reflective mirror, also behind the liquid crystal cell, which can return incident light towards the observer.

Organic light-emissive materials have been devised to emit light over a range of colours, and a full set of red- green- and blue-emitting polymers are now available. Emission colour of electroluminescent materials in devices has been controlled in one of several ways. Firstly, it is known to use a semiconductive conjugated co-polymer comprising at least two chemically different monomer units which have different semiconductor band gaps when existing in their individual homo-polymer forms. The relative proportions of the monomer units may be varied to alter the semiconductor band gap so as to control the optical properties of the resultant co-polymer (see WO92/03490). Another approach, particularly suitable for producing a single white light-emitting layer, involves depositing on a substrate a mixture of blue and red-type organic electroluminescent materials using a flash vacuum deposition process. (See JP 0921989).

The present applicant has appreciated the desirability of white light-emitting devices, both for use as point sources as well as backlights for LCD displays of mobile phones and the like. The present applicant has devised a novel device which is able to operate at a lower voltage than white light-emitting, mixed organic electroluminescent material known in the prior art.

In accordance with a first aspect of the present invention, there is provided a light-emitting device comprising a first electroluminescent element for emitting light of a first colour when energised and a second electro luminescent element for emitting light of a second colour when energised, characterised in that dimensions of the first and second elements and any spacing therebetween are selected to create an impression of a single light source when the elements are simultaneously energised and viewed as intended.

The present applicant believes that such a light-emitting device may provide a convenient way of achieving a particular lighting effect, especially if the desired colour of the light is difficult to achieve with a single electroluminescent material. This is because in perceiving a single light source, it is believed the viewer viewing the device in the intended manner will also perceive a single colour of light, determined in part by the sum of the first and second colours. If the first and second colours are different, the single colour of light perceived will also be different.

The first and second elements may be energised by a common bias. In other words, the elements may share the same anode and cathode. Such a construction would be relatively simple to manufacture, and is to be contrasted with known devices where different light emitting regions are independently energised.

In one embodiment, at least one of the electro luminescent elements comprises an organic light-emissive material. The material may be a polymer, perhaps a conjugated polymer. The organic light-emissive material may be deposited on a substrate, perhaps by a process of ink-jet deposition. Ink-jet deposition enables efficient, fine and accurate definition of the at least one electroluminescent element. Each element may have a generally circular profile over the surface of the substrate. Ink-jet deposition could readily deposit such "dots" in a compact and reproducable array (65,000 dots per $cm^2$).

The first electroluminescent element may be one of a plurality of such elements for emitting light of the first colour when energised, the plurality of elements being arranged in a first spaced-apart array. The second electroluminescent element may be one of a plurality of such elements for emitting light of the second colour when energised, the plurality of second light-emitting elements being arranged in a second spaced-apart array. The first and second spaced-apart arrays may overlap, with each element of the first spaced-apart array adjacent to elements of the second spaced-apart array. The first and second spaced-apart arrays may share energising electrodes.

The dimensions of the discrete elements and any spacings between adjacent elements may be less than the limit of resolution of the naked eye, say less than $1.0 \times 10^{-4}$ meters when the object is placed at the near point. The maximum dimension of the elements on the surface of the substrate may be less than $5.0 \times 10^{-6}$ meters; and the maximum spacing between adjacent elements in the plane of the substrate may be less than $5.0 \times 10^{-6}$ meters. In one form, the spacing between adjacent elements may be negligible or even non-existent (i.e. adjacent elements contact a common insulator). Such fine dimensions and spacings may be particularly useful in small (hand held) electronic articles incorporating the light-emitting device, where visual acuity and achieving maximum fill factor (minimising dark areas) are important considerations. However, with larger articles, which are intended to be viewed from distances greater than one arm's length, the size of and spacings between elements become less critical. This is because the minimum feature size resolvable to the naked eye is dependent on viewing distance (i.e distance between object and observer). The angular resolving power of the naked eye remains constant, so as the distance increases, so does the size of the minimum feature which is resolvable.

The first and second colours of the first and second organic light-emissive materials may be selected from the group consisting of red, green and blue. By selecting one red emitter and one green emitter, it may be possible to give the impression of a substantially white light-emitting device. The device may further comprise a third electroluminescent element for emitting light of a third colour, the dimensions of the third element and any spacing between the third and adjacent elements being selected to create the impression of a single light source where all the elements are energised and viewed as intended. The first, second and third organic light-emissive materials may be selected to produce red, green and blue light emissions respectively.

The hue or colour temperature of the single light perceived by an observer may be varied by modifying the relative proportions (i.e. areal density) of the different elements. Accordingly, the different arrays may cover different proportions of the substrate, either by varying sizes or numbers of elements. For example, the proportions of the substrate covered by the red, green and blue light-emitting material may be present respectively in the ratio 100:1:3.7(?)

The light emitting elements may be mounted on a substrate and confined within an area of $2.5 \times 10^9$ m$^2$ (a square of sides 50 $\mu$m). Such a light emitting device would be on the same size scale as a light emitting diode, and may thus be regarded as a point source emitter, at least to the naked eye.

There is also provided an electronic device comprising an LCD display and a backlight comprising a light-emitting device in accordance with the first aspect of the invention.

In accordance with a second aspect of the present invention, there is provided a method of manufacturing a light-emitting device, comprising providing a first electroluminescent element for emitting light of a first colour when energised; providing a second element for emitting light of a second colour when energised; characterised by: selecting dimensions of the elements and any spacing therebetween to create an overall impression of a single light source when simultaneously energised and viewed as intended.

The method may further comprise energising the elements with a common bias. This may be achieved by coupling the elements to a common anode and a common cathode.

The method may further comprise providing a plurality of electroluminescent elements for emitting light of the first colour when energised, the plurality of first-colour light-emitting elements being arranged in a spaced-apart array with the first electroluminescent element. The method may also comprise providing a plurality of electroluminescent elements for emitting light of the second colour when energised, the plurality of second-colour-light-emitting elements being arranged in a spaced-apart array with the second electroluminescent element. The spaced-apart arrays of the first and second elements may share energising electrodes. In one embodiment, the method comprises disposing the first electroluminescent element adjacent second-colour-light-emitting elements.

The first or second organic light-emissive materials may be deposited by a process of ink-jet printing.

In another aspect of the invention, there is provided a light-emitting device comprising a first element for emitting light of a first colour, a second element for emitting light of a second colour, and an electrode common to both elements for actuating light emission, wherein the size and any spacings between the first and second elements are selected to create the impression of a single light source when the elements are actuated simultaneously and viewed as intended.

The first and second elements may comprise semiconducting or electroluminescent materials. The light-emitting device may further comprise an additional electrode common to both elements for actuating light emission.

An embodiment of the invention will now be described, by way of example, with reference to the accompanying figures, in which.

Figure 1:
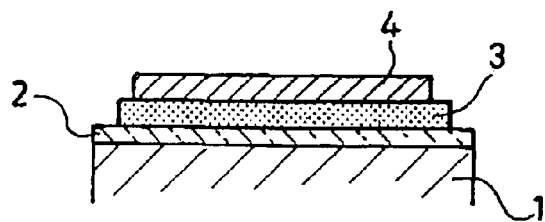
FIG. 1 is a schematic illustration of an organic light-emissive device known in the art.
Figure 2:
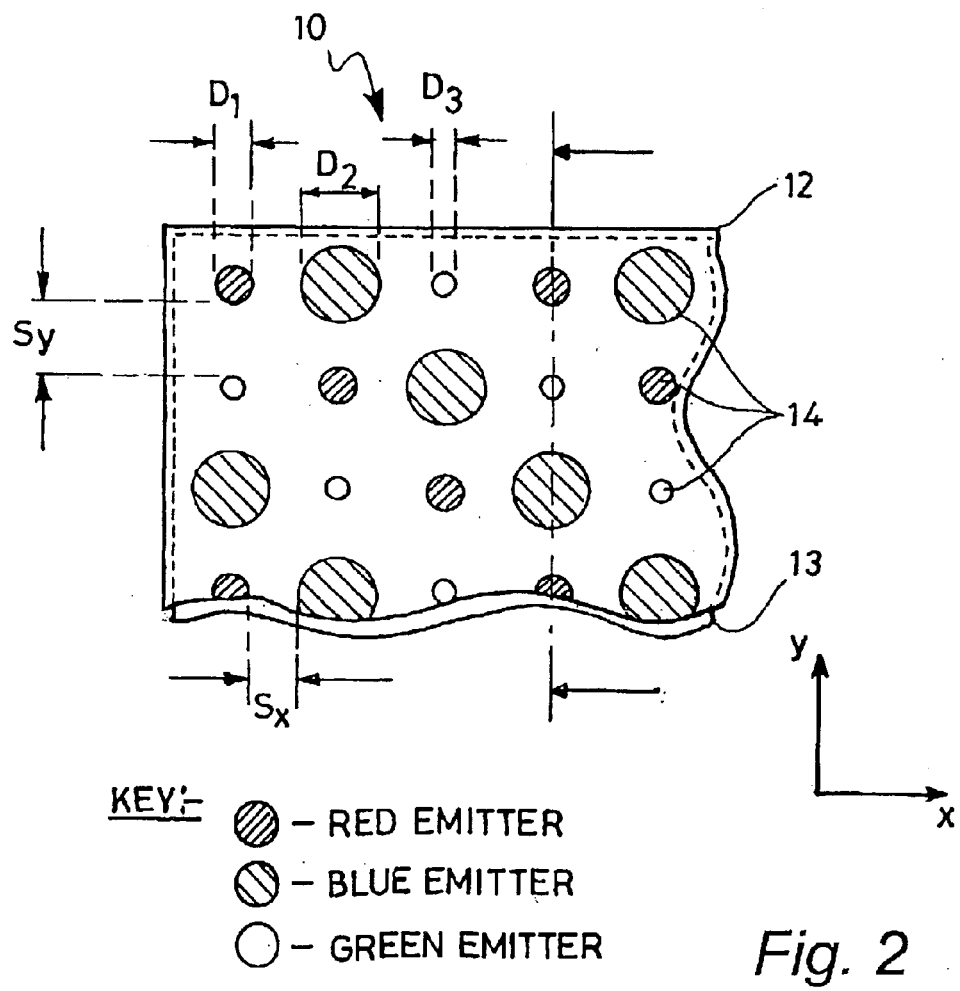
FIG. 2 is a schematic underside view of part of an electroluminescent device embodying the present invention.

FIG. 2 illustrates part of an electroluminescent device (10) for use in a small electronic article embodying the present invention, as viewed through a transparent glass substrate (12) and a transparent first electrode (13). On the underside of the substrate (12) and first electrode (13), three arrays of different organic light-emissive materials are deposited, each of which is able to emit light of a different colour when energised, namely red (R), green (G) and blue (B). Each array comprises a multitude of dot-like elements (14), with elements of different arrays being interleaved without overlapping adjacent elements to provide a relatively homogeneous distribution of elements across the surface of the substrate (12) and first electrode (13). The diameters ($D_1$, $D_2$, $D_3$) of the dot-like elements (14) vary according to which organic light emissive materials are used, but all are typically $5 \times 10^{-6}$ m or less. Similarly, the spacings ($S_x$ and $S_y$) between the dot-like elements (14) in the X and Y directions vary, but all are typically $5 \times 10^{-6}$ m or less. Neither the individual dot-like elements (14) nor the spacings between them are capable of being resolved by the naked eye of an observer. The relative proportions of dot-like elements (14R:14G:14B) are chosen to provide particular amounts of red, green and blue light which give the impression of a white-light-emitting source.

Suppose, for example, that the three different organic light-emissive materials emit light with the following CIE co-ordinates: (0.677,0.311) Red; (0.400, 0.573) Green; and (0.178,0.220) Blue. Given the luminance voltage/current characteristics for light emitting polymer devices (with electroluminescent layer thicknesses in the range 60–80 nm), the relative area of each material (scaled to the green emitter) required to produce one kind of white light is shown in Table 1 for various voltages. The corresponding luminance of the materials is shown in Table 2 for various voltages. It is noted that not only does the luminance of each material vary with voltage, but also the luminance of the three materials at the same voltage is significantly different. At low voltages and low luminance requirements (say 3–5V and circa 100 cd/m$^2$), the thickness of the electroluminescent layers producing the red and green light may be increased to even up the area ratio.

Figure 3:
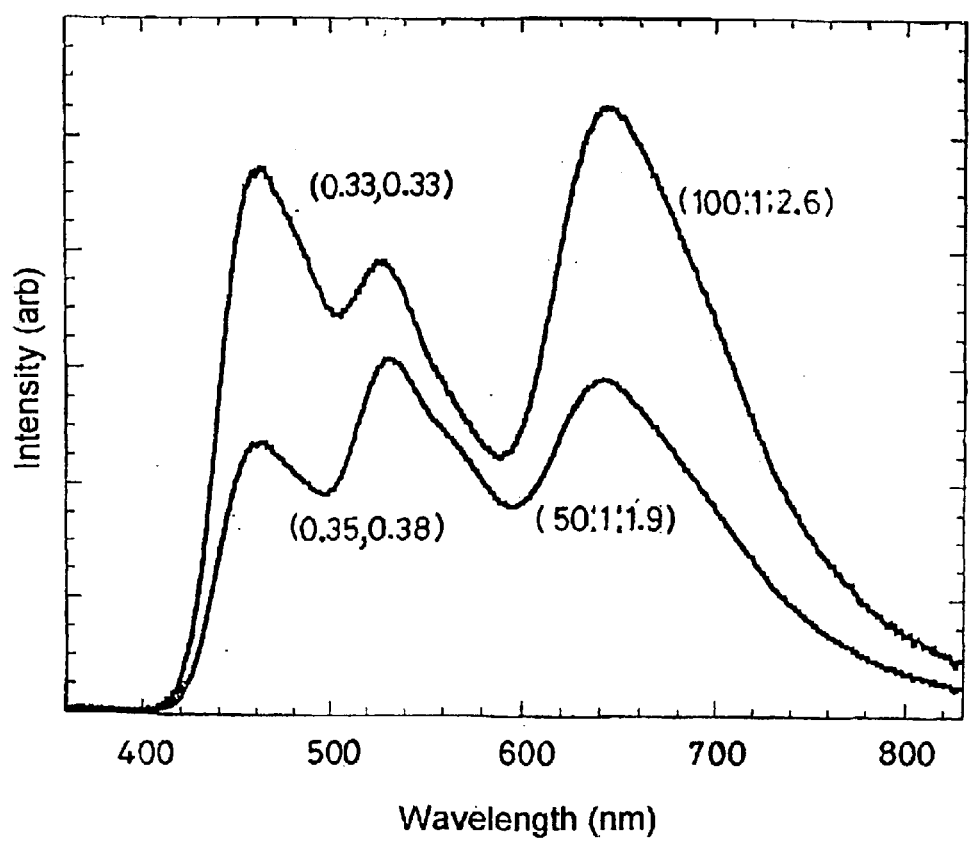
FIG. 3 is an intensity/wavelength plot for light which may be emitted from a device of the kind shown in FIG. 2.

According to Table 1 at an operating bias of 5 volts, the required areal ratio of blue to green is 8 to 1, and the areal ratio of red to green is approximately 2 to 1, in order to produce one kind of white light, e.g. white light of a cool colour, corresponding to say 600K. By varying the ratios of blue to green and red to green, different white-colour hues may be achieved. It is possible to produce examples which achieve the following white colour points: (0.374,0.330) and 3V; (0.355,0.375) at 4V; and (0.355,0.376) at 5V. Two typical white spectra are shown in FIG. 3; one curve has been calculated to give the white colour (0.33,0.33) at 4V and requires the following ratio (100:1:3.7) of red-light: green light: blue light producing areas.

Figure 4:
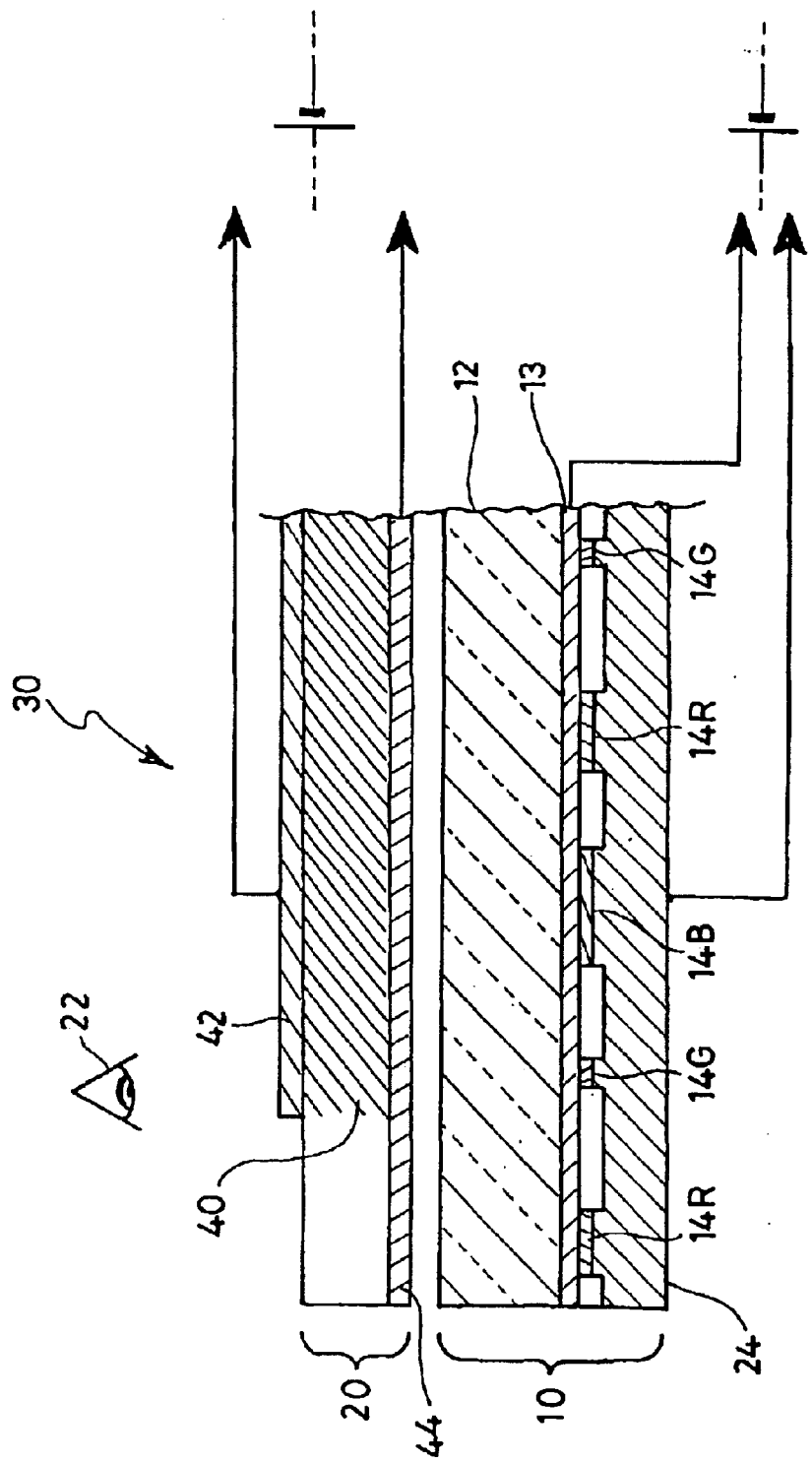
FIG. 4 is a schematic cross-sectional illustration of a display comprising the electroluminescent device of FIG. 2.

The display (30) of FIG. 4 comprises the electroluminescent device (10) of FIG. 2 used as a backlight underneath a planar LCD unit (20), such that light emitted from the device (10) can pass through any light-transmissive regions in the LCD (20) and towards an observer (22). The light-emissive regions of the device (10) are sandwiched between anode and cathode electrodes. The cathode electrode (24) is common to all light-emissive regions, as is the anode electrode (13) Thus the light-missive regions (14R,14G,14B) are energised by a common bias. The anode (13) is formed of a light-transmissive material which is deposited on the glass substrate (12).

The LCD unit (20) is a normal passive-matrix LCD device and includes a pixel (40) which may be activated using electrodes (42,44) to control transmission of light from device (10) through the pixel (40). When light is transmitted through or around the pixel (40), the observer (22) perceives the backlight as a white emitter. This is because the naked eye of the observer (22) is unable to resolve the individual elements (14R,14G,14G) and spaces therebetween and thus the light emitted by each element is summed by the eye to give the impression of a single source of white light.

Figure 5:
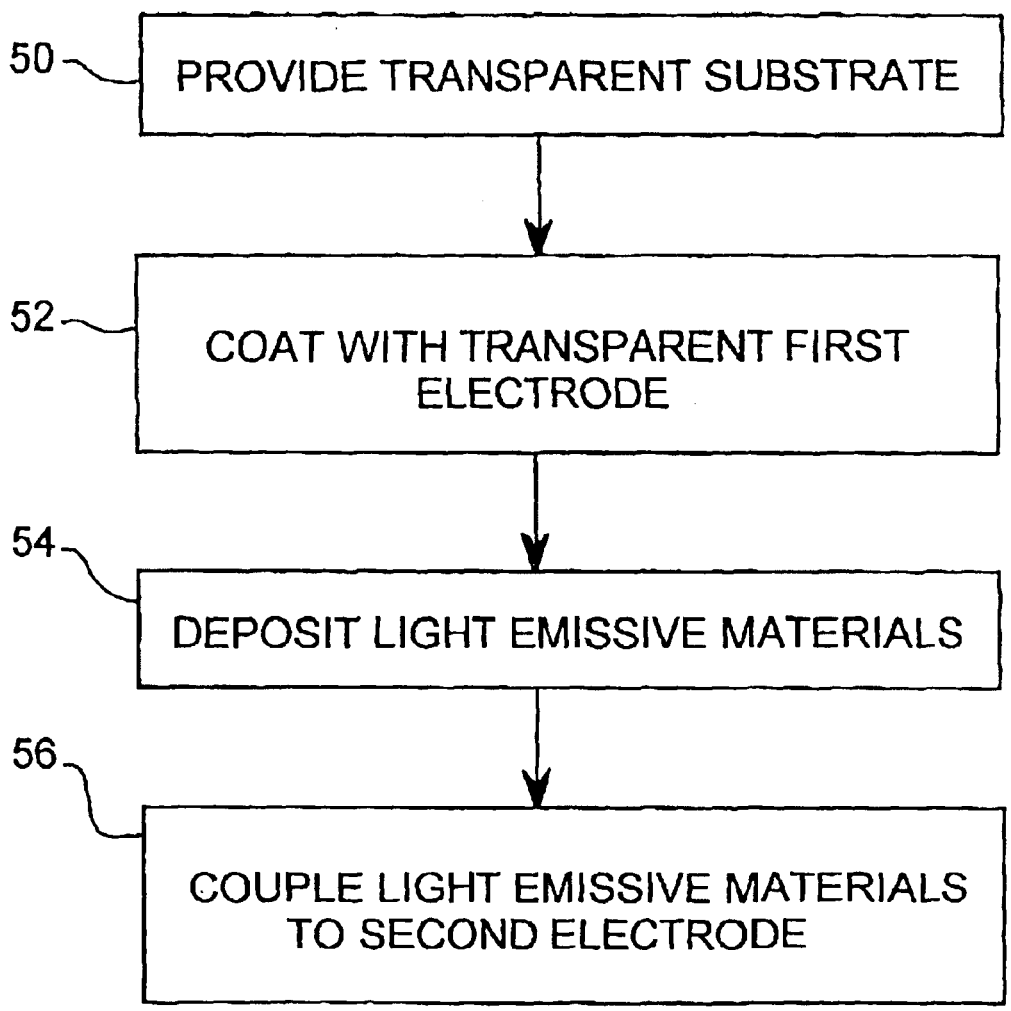
FIG. 5 is a flow chart illustrating the fabrication of the device of FIG. 2.

Referring to FIG. 5, a method of fabricating the light-emitting device (10) will now be described. A transparent substrate (12) is provided at step (50) and is then coated with a transparent first electrode (13) at step (52). Next, at step (54), red, green and blue light emissive materials in liquid form are deposited by a process of ink jet printing dot-like elements onto the transparent first electrode. The size of the dot-like elements may vary between the different materials in order to achieve the correct proportions required for producing white-light emissions. Alternatively, or additionally, the relative numbers of dot-like elements may vary in order to achieve the desired proportionality. After the deposited materials have dried or been cured, the dot-like elements are electrically coupled at step 56 to a planar second electrode which may have a profile including recesses which register with gaps between the dot-like elements. The recesses may help to reduce short circuits between the first and second electrodes. The application of a common electrical bias of say 5 volts across the first and second electrodes will give rise to electroluminescent emissions from the light-emissive materials in an amount to yield a cummulative white-light effect to an observer.

TABLE 1

Relative areas of red, green and blue light-producing materials which are required for one kind of white light, at given voltages.

|  | 3 V | 4 V | 5 V |
|---|---|---|---|
| Blue | 100 | 50 | 8 |
| Green | 1 | 1 | 1 |
| Red | 0.98 | 1.9 | 1.9 |

TABLE 2

Luminance (cd/m$^2$) of red, green and blue light-producing materials at given voltages.

|  | 3 V | 4 V | 5 V |
|---|---|---|---|
| Blue | 2.7 | 232 | 1260 |
| Green | 561 | 5756 | 11591 |
| Red | 147 | 475 | 944 |

What is claimed is:

1. A method of manufacturing a light-emitting device, comprising:

providing a first electroluminescent element for emitting light of a first colour when energised;

providing a second electroluminescent element for emitting light of a second colour when energised; characterised by:

selecting dimensions of the first and second elements and any spacing therebetween to create an overall impression of a single light source when simultaneously energised and viewed as intended.

2. A method according to claim 1, further comprising providing means, common to both elements, for energising the elements.

3. A method according to claim 1, further comprising providing a plurality of electroluminescent elements for emitting light of the first colour when energised, the plurality of first-colour-light emitting elements being arranged in a spaced-apart array with the first electroluminescent element.

4. A method according to claim 1, further comprising providing a plurality of electroluminescent elements for emitting light of the second colour when energised, the plurality of second-colour-light emitting elements being arranged in a spaced-apart array with the second electroluminescent element.

5. A method according to claim 4, in which the first electroluminescent element is adjacent or disposed between second-colour-light emitting elements.

6. A method according to claim 1, in which at least one of the electroluminescent elements comprises an organic light-emissive material.

7. A method according to claim 6, further comprising depositing the organic light-emissive material by a process of ink-jet deposition.

8. A method according to claim 7, in which the deposited organic light-emissive material comprises at least one dot having a maximum dimension of $5.0 \times 10^{-6}$ m.

* * * * *